US010243529B2

(12) United States Patent
Snyder et al.

(10) Patent No.: US 10,243,529 B2
(45) Date of Patent: Mar. 26, 2019

(54) SATELLITE MICROPHONE ASSEMBLY

(71) Applicant: Cisco Technology, Inc., San Jose, CA (US)

(72) Inventors: Ian M. Snyder, San Francisco, CA (US); Matthew Cho, San Francisco, CA (US); Nicholas Kawamoto, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/686,498

(22) Filed: Aug. 25, 2017

(65) Prior Publication Data

US 2017/0353168 A1 Dec. 7, 2017

Related U.S. Application Data

(63) Continuation of application No. 15/140,255, filed on Apr. 27, 2016, now Pat. No. 9,793,869.

(51) Int. Cl.
*H04R 1/02* (2006.01)
*H03G 3/04* (2006.01)
(Continued)

(52) U.S. Cl.
CPC ............ *H03G 3/04* (2013.01); *G01D 5/3473* (2013.01); *G06F 3/0346* (2013.01); *H04M 3/56* (2013.01); *H04R 1/04* (2013.01); *H04R 1/08* (2013.01); *H04R 29/004* (2013.01); *H04R 2420/07* (2013.01); *H04R 2430/01* (2013.01)

(58) Field of Classification Search
CPC .......... H03G 3/04; G01D 5/3473; H04R 1/04; G06F 3/0346; H04M 3/56
See application file for complete search history.

(56) References Cited

U.S. PATENT DOCUMENTS

2002/0019731 A1 2/2002 Masui
2005/0285935 A1* 12/2005 Hodges ................. H04M 9/082
348/14.08
(Continued)

FOREIGN PATENT DOCUMENTS

EP 2262278 12/2010

OTHER PUBLICATIONS

International Search Report and Written Opinion from the International Searching Authority for the corresponding International Application No. PCT/US2017/028784, dated Jul. 31, 2017, 11 pages.

*Primary Examiner* — Simon King
(74) *Attorney, Agent, or Firm* — Polsinelli PC

(57) ABSTRACT

In one embodiment, a satellite microphone assembly for use in teleconferencing or other audio based communications comprises a base housing a microphone and volume control electronics. The base is enclosed by a cylinder, rotatable about the base and having a top surface configured to be an actuatable button to toggle a mute/unmute status of the microphone. The cylinder has a sidewall configured to be engaged by a user such that the user can rotate the cylinder. An optical sensor is supported by the base, and is configured to detect a rotation of the cylinder and to output information about a direction and a degree of rotation of the cylinder to the volume control electronics, causing a rotation of the cylinder to affect the volume level of a speaker.

20 Claims, 9 Drawing Sheets

(51) Int. Cl.
  *G01D 5/347* (2006.01)
  *G06F 3/0346* (2013.01)
  *H04R 1/04* (2006.01)
  *H04R 1/08* (2006.01)
  *H04R 29/00* (2006.01)
  *H04M 3/56* (2006.01)

(56) References Cited

U.S. PATENT DOCUMENTS

| | | | | |
|---|---|---|---|---|
| 2005/0286443 | A1* | 12/2005 | McMillen | H04M 3/56 |
| | | | | 370/260 |
| 2007/0009118 | A1* | 1/2007 | Kimura | H04R 27/00 |
| | | | | 381/172 |
| 2007/0091063 | A1* | 4/2007 | Nakamura | G06F 3/016 |
| | | | | 345/156 |
| 2011/0040962 | A1* | 2/2011 | Peyre | H04M 1/605 |
| | | | | 713/100 |
| 2013/0177191 | A1* | 7/2013 | Waguri | H04R 5/027 |
| | | | | 381/356 |
| 2014/0267024 | A1* | 9/2014 | Keller | G06F 3/017 |
| | | | | 345/156 |
| 2015/0244336 | A1* | 8/2015 | Desmarais | H03G 1/02 |
| | | | | 381/105 |
| 2016/0100817 | A1* | 4/2016 | Hussain | A61B 7/04 |
| | | | | 600/301 |

* cited by examiner

SATELLITE MICROPHONE ASSEMBLY

RELATED APPLICATIONS

This application is a continuation of U.S. patent application Ser. No. 15/140,255 filed on Apr. 27, 2016, the contents of which is incorporated by reference in its entirety.

TECHNICAL FIELD

The present invention relates to conference equipment, and more specifically to a satellite microphone for a speakerphone.

BACKGROUND

Wired satellite microphones are commonly used in teleconferencing hardware, such as speakerphones and conference room audio equipment, and are connected to a base station of the speakerphone or multiplexer/controller of conference room audio equipment. Whereas microphones provided in the base station of the teleconferencing hardware may be remote from some participants in a call, wired satellite microphones improve the voice quality of a call by placing the microphone closer to a user, thereby yielding a better signal to noise ratio.

Wired satellite microphones might provide a mute function via a discrete button on the surface of the wired satellite microphone, which allows a participant to turn off his or her microphone at will (or even all of the microphones connected to the teleconferencing hardware), and remove his or her audio stream from the call. However, the mute button is often small or hard to locate, particularly for a user unfamiliar with a given wired satellite microphone. Furthermore, while wired satellite microphones may offer a mute function, they do not offer any physical way to control the volume level of a speaker(s).

DESCRIPTION OF EXAMPLE EMBODIMENTS

Figure 1A:
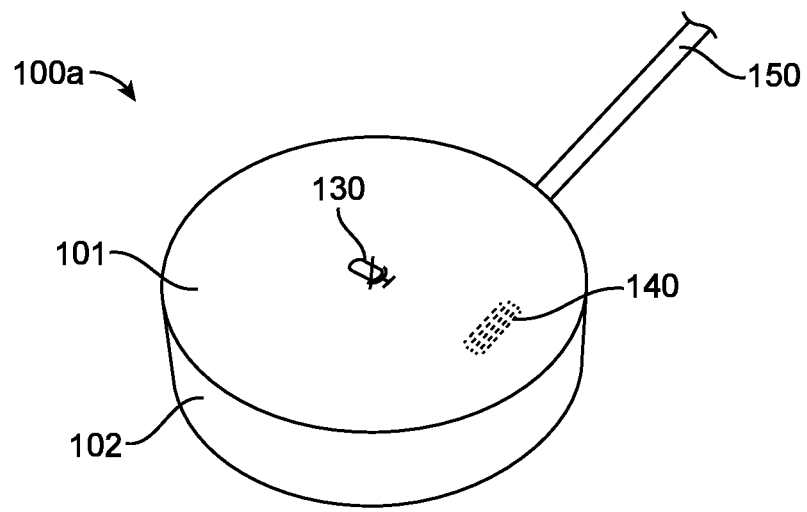
FIG. 1A illustrates an exterior view of an example embodiment of a satellite microphone assembly.

Overview:

In one embodiment, a satellite microphone assembly for use in teleconferencing or other audio based communications comprises a base housing a microphone and volume control electronics, and may be connected to a base station of the speakerphone or multiplexer/controller of conference room audio equipment. The base is enclosed by a cylinder, which is rotatable about the base, the cylinder further having a top surface configured to be an actuatable button to toggle a mute/unmute status of the microphone. The cylinder has a sidewall configured to be engaged by a user such that the user can rotate the cylinder about the base. An optical sensor is supported by the base, and can be configured to detect a rotation of the cylinder and to output information about a direction and a degree of rotation of the cylinder to the volume control electronics, causing a rotation of the cylinder to affect the volume level of a speaker.

Example Embodiments

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A illustrates an exterior view of an example embodiment of a satellite microphone assembly 100 for use in teleconferencing or other audio communication systems. One or more satellite microphone assemblies may be communicatively linked to a base station (not pictured) via a connecting cable 150, which supplies electrical power and transmits data between the base station and satellite microphone assembly 100. In some embodiments, a wireless connection may be used for the transmission of data between the base station and satellite microphone assembly 100.

Figure 1B:
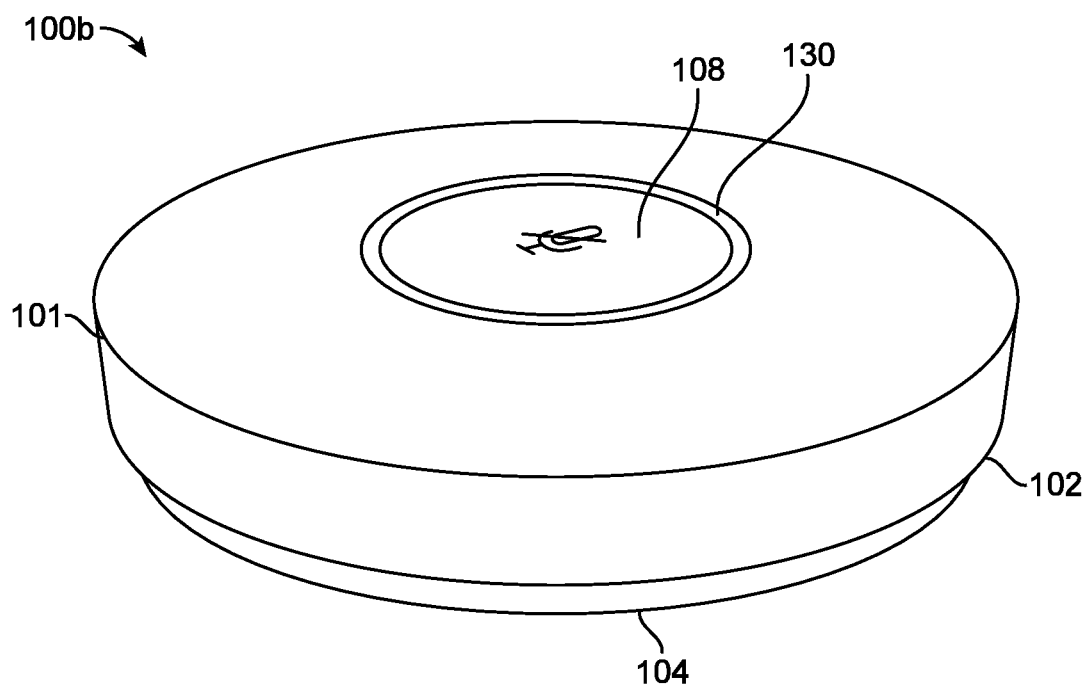
FIG. 1B illustrates an exterior view of an example embodiment of a satellite microphone assembly.

FIG. 1B illustrates an exterior view of another example embodiment of a satellite microphone assembly 100b for use in teleconferencing or other audio communication systems.

Figure 1C:
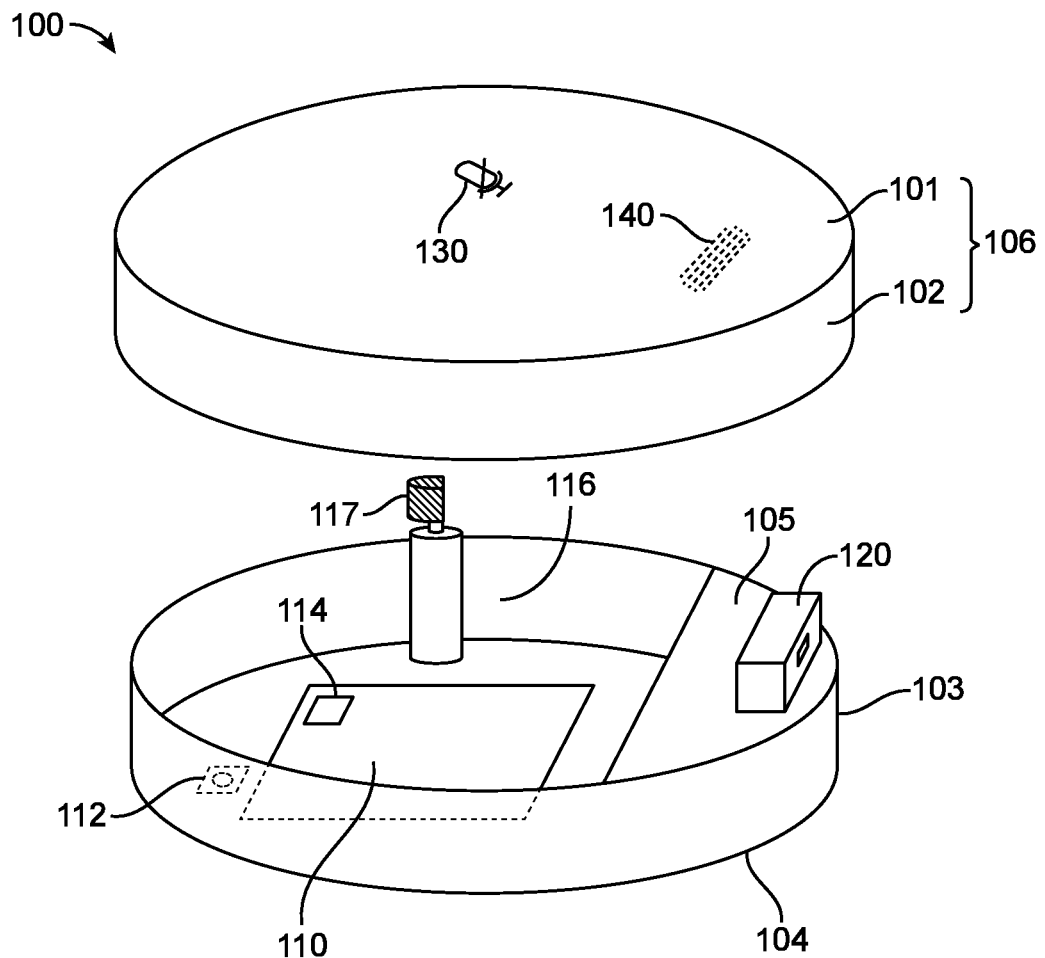
FIG. 1C illustrates an exploded view of an example embodiment of a satellite microphone assembly.

FIG. 1C illustrates an exploded view of the satellite microphone assembly 100, with internal components depicted in a simplified manner at an exaggerated scale for purposes of explanation, and it is further understood that the internal components of satellite microphone assembly 100b can be substantially the same as those pictured.

In FIG. 1A, a cylindrical top portion 106, comprising a top surface 101 and a top sidewall 102, encloses a base portion 104 and is continuously rotatable about base portion 104 in both the clockwise and counter-clockwise directions. Cylindrical top portion 106 is of a greater diameter than base portion 104, such that the top portion may rotate freely. Rotation of the cylindrical top portion about the base portion is configured to adjust the volume of a speaker, which is typically contained in the base station. For example, rotation of cylindrical top portion 106 in a clockwise direction may cause the volume of the speaker to be increased, while rotation of cylindrical top portion 106 in a counter-clockwise direction may cause the volume of the speaker to be decreased. A volume indicator 140 is further provided in order to indicate the current or user-selected volume level of the speaker, and in some embodiments, may be provided as one or more LEDs or other lighting elements.

In some embodiments, as seen in FIG. 1B, both top surface 101 and base portion 104 may remain stationary, while top sidewall 102 is continuously rotatable about top surface 101 and base portion 104, in both the clockwise and counter-clockwise directions. As described previously, rotation of top sidewall 102 is configured to adjust the volume of a speaker, with clockwise and counter-clockwise rotations corresponding to different adjustments in volume level. Base portion 104 may be configured to have a smaller diameter than at least top sidewall 102, such that top sidewall 102 is free to rotate relative to base portion 104.

In some embodiments, the rotation of top sidewall 102 is detected by an optical sensor 120, which outputs information about the direction and degree of rotation to a volume control electronics 110. Optical sensor 120 can be mounted on a support layer 105 such that it can be elevated above the height of a base sidewall 103. This configuration provides a line of sight between optical sensor 120 and the interior surface of top sidewall 102, thereby allowing optical sensor 120 to detect rotation. Persons of ordinary skill in the art would appreciate that support layer 105 is not a necessary component of satellite microphone assembly 100, and various means may be used to ensure that optical sensor 120 has a direct line of sight to the interior surface of top sidewall 102. In some embodiments, the rotation of top sidewall may be detected mechanically, through the use of devices such as potentiometers or other control knobs, as would be appreciated by persons of ordinary skill in the art.

Upon receipt of the information about the direction and degree of rotation, volume control electronics 110 causes the volume of the speaker to be correspondingly adjusted, causes volume indicator 140 to update to indicate a new selected volume level of the speaker, and in some embodiments, controls a haptic actuator 116 that is configured to output vibrations tuned to produce a tactile feedback as top sidewall 102 is rotated. In various embodiments, mechanical devices such as detents can be used to produce tactical feedback as top sidewall 102 is rotated. This tactile feedback is provided to provide real-time confirmation of the volume adjustments. In some embodiments, haptic actuator 116 rotates an off-center weight 117 in order to produce vibrations, although persons of ordinary skill in the art would appreciate that various types of haptic actuators may be used in order to produce the tactile feedback. The vibrations may be tuned to reflect discrete steps of volume adjustment, e.g. if there are 10 discrete steps of volume adjustment then haptic actuator 116 can output vibrations every successive instance that top sidewall 102 is rotated by 36 degrees. Alternatively, the vibrations may be tuned to reflect continuous volume adjustment. In some embodiments, vibration strength is a function of the current volume level.

Top surface 101 can be an actuatable button to toggle a mute/unmute function of a microphone 112, whereby a received user touch or user press of top surface 101 engages the actuatable button function. A mute indicator 130 indicates the mute/unmute status of the microphone and can be provided as an LCD display, or LED lighting element, for example. In some embodiments, the entirety of top surface 101 can be configured to receive a user touch or press. In further embodiments, only an actuatable button portion 108 of top surface 101 may be configured to receive a user touch or press, with actuatable button portion 108 having some surface area that is lesser than or equal to the surface area of top surface 101.

An accelerometer 114 outputs acceleration data to volume control electronics 110, thereby detecting either a resting state or a movement state of satellite microphone assembly 100. While illustrated as a constituent component of the volume control electronics in FIG. 1A, persons of ordinary skill in the art would appreciate that accelerometer 114 may be located anywhere within the satellite microphone assembly 100 so long as it is communicatively linked to the volume control electronics 110. In a resting state of satellite microphone assembly 100, accelerometer 114 may detect zero or minimal acceleration, ignoring any effects of gravity. For example, a resting state might correspond to satellite microphone assembly 100 resting flat on a table. In a resting state, volume control electronics 110 are enabled and operative to capture input to the actuatable button function of top surface 101 and volume level adjustment input to sidewall 102. The resting state may be determined instantaneously or determined over some pre-defined period of time. In the resting state, satellite microphone assembly 100 functions normally and as described above.

However, if satellite microphone assembly 100 is picked up or otherwise physically moved, particularly during an active phone call or other audio transmission session, one or more of the mute function and the volume level adjustment function may be inadvertently toggled or otherwise engaged. Such control inputs are undesirable, and as such, accelerometer 114 is configured to detect a moving state of satellite microphone assembly 100 and disable volume control electronics 110. A moving state is generally understood to correspond to a translational velocity along one or more of the axes of detection of accelerometer 114, wherein acceleration in the direction of each axis is either not currently substantially equal to zero or has not remained substantially equal to zero for some pre-defined period of time. By disabling volume control electronics 110, any inadvertent input will be ignored, and no mute or volume adjustments may be made until the satellite microphone assembly 100 returns to a resting state. In some embodiments, it may be possible to disable this feature of satellite microphone assembly 100 and simply keep volume control electronics 110 in a constantly enabled state.

Figure 2A:
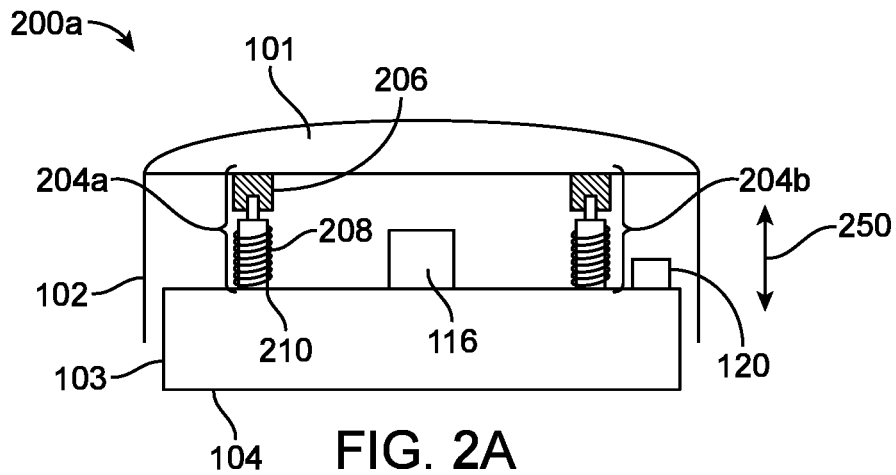
FIG. 2A illustrates a cross-section view of an example embodiment for a mechanism to capture a received user touch or user press for toggling a mute/unmute state of a microphone.
Figure 2B:
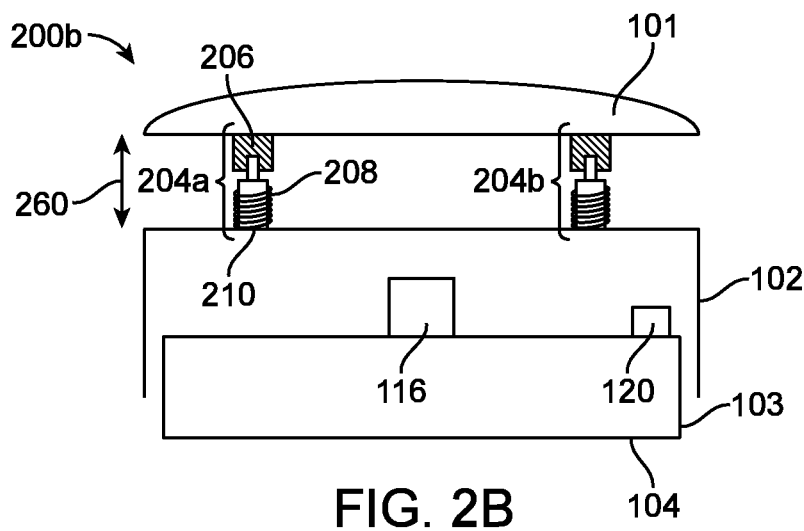
FIG. 2B illustrates a cross-section view of an example embodiment for a mechanism to capture a received user touch or user press for toggling a mute/unmute state of a microphone.
Figure 2C:
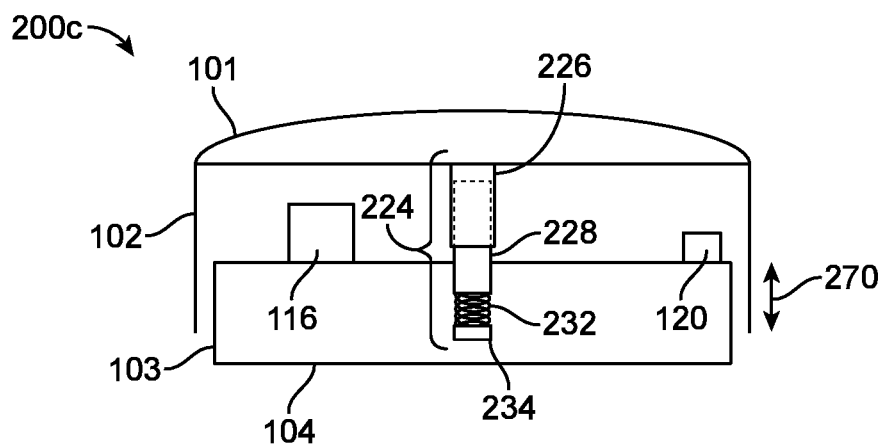
FIG. 2C illustrates a cross-section view of an example embodiment for a mechanism to capture a received user touch or user press for toggling a mute/unmute state of a microphone.

FIG. 2A-2C illustrate exemplary embodiments for a mechanism to capture a received user touch or user press of top surface 101 to engage the actuatable button function for toggling a mute/unmute state of microphone 112. FIG. 2A illustrates a cross-sectional view of an example embodiment 200a wherein top surface 101 and top sidewall 102 are integrally connected to one another, or otherwise rigidly fixed such that the two pieces move substantially together when translated in the vertical direction indicated by arrow 250. In other words, the cylindrical top portion composed of top surface 101 and top sidewall 102 is functionally a continuous, single piece capable of vertical translation relative to base portion 104. In such embodiments, the vertical translation is effectuated by a pair of spring button assemblies 204a and 204b, which attach top surface 101 to base portion 104.

A connection point 206 is rigidly affixed at an upper end to the interior surface of top surface 101, or may be integrally formed with top surface 101 as a single component. At a lower end, connection point 206 is slidably engagable with a spring portion 208. Spring portion 208 provides a resistive feedback force responsive to the received user touch or user press of top surface 101, and may have a spring constant k that is tuned to provide sufficient stiffness to reject accidental triggering of the actuatable button function.

When a sufficiently forceful received user touch or press of top surface 101 is registered, the cylindrical top portion is displaced downwards, closer to base portion 104, and causes a signal to be sent to volume control electronics 110 indicative that spring button assemblies 204a and 204b have been actuated. Upon receipt of this actuation signal, volume control electronics 110 toggles the mute/unmute status of microphone 114 and may also correspondingly update volume indicator 140. The cylindrical top portion remains fixed in this downwardly displaced position, until a second sufficiently forceful received user touch or press is registered at top surface 101 to actuate spring button assemblies 204a and 204b and cause the cylindrical top portion to displace upwards, farther away from base portion 104, the restoring force being provided by the spring portions 208. In order to allow the cylindrical top portion to rotate freely about base portion 104 to make volume adjustments, a circular track may be provided to engage and support a bottom portion of spring button assemblies 204a and 204b. The location of the circular track in the cross section is indicated at a circular track position 210.

FIG. 2B illustrates a cross-sectional view of an example embodiment 200b wherein top surface 101 and top sidewall 102 are not integrally connected to one another, or otherwise rigidly fixed relative to one another. Top surface 101 may be actuated by a received user touch or press and thereby be caused to translate relative to top sidewall 102 and base portion 104 in the vertical direction indicated by arrow 260. In such embodiments, persons of ordinary skill in the art would appreciate that top sidewall 102 and base portion 104 are may be rigidly fixed relative to one another in the vertical direction while remaining free to rotate relative to one another. Spring button assemblies 204a and 204b provide the same function as previously described wherein a sufficiently forceful received user touch or press of top surface 101 causes volume control electronics 110 to toggle the mute/unmute status of microphone 114, and a circular track position 210 is provided to allow the free rotation of top surface 101 and top sidewall 102 about base portion 104 to make volume adjustments.

FIG. 2C illustrates a cross-section view of an example embodiment 200c that makes use of only a single spring button assembly 224, here centrally disposed along the vertical axis of the satellite microphone assembly 200c. In such embodiments, top portion 101 and top sidewall 102 are integrally connected to one another, or otherwise rigidly fixed such that the two pieces move substantially together when translated, relative to base portion 104, in the vertical direction indicated by arrow 270.

Single spring button assembly 224 comprises a hollow outer connector sleeve 226, and inner connector rod 228, a spring 232, and a button switch 234. Outer connector sleeve 226 is rigidly affixed at its upper end to the interior surface of top surface 101, or may be integrally formed with top surface 101 as a single component, and may be additionally rigidly affixed along its hollow interior with inner connector rod 228. Inner connector rod 228 is affixed at its lower end to a top portion of spring 232, which extends some vertical length before attaching, at its bottom portion, to button switch 234, the button switch being rigidly affixed to base portion 104 in the vertical direction.

As such, a sufficiently forceful received user touch or press will cause top portion 101, top sidewall 102, outer connector sleeve 226, inner connector rod 228, and spring 232 to synchronously move through an identical vertical displacement. As before, spring portion 232 provides a resistive feedback force responsive to the received user touch or press of top surface 101, and may have a spring constant k that is tuned to provide sufficient stiffness to reject accidental triggering of the actuatable button function of button switch 234. However, as such embodiments may contain only a single spring, the spring constant k may be larger than in various embodiments with two or more springs.

Single spring button assembly 224 provides the same function as previously described whereby when a sufficiently forceful received user touch or press of top surface 101 is registered, the cylindrical top portion is displaced downwards, closer to base portion 104, and causes spring 232 to compress and actuate button switch 234. Upon receipt of this actuation signal, volume control electronics 110 toggles the mute/unmute status of microphone 114 and may also correspondingly update volume indicator 140. The cylindrical top portion remains fixed in this downwardly displaced position, until a second sufficiently forceful received user touch or press of top surface 101 is registered and actuates single spring button assembly 224 to cause the cylindrical top portion to displace upwards, farther away from base portion 104, the restoring force being provided by spring 232.

In order to allow the cylindrical top portion to rotate freely about base portion 104 to make volume adjustments, in some embodiments outer connector sleeve 226 and inner connector rod 228 may be arranged such that outer connector sleeve 226 (and the attached cylindrical top portion) is free to rotate about inner connector rod 228 and base portion 104. In various embodiments, outer connector sleeve 226 and inner connector rod 228 may be rigidly connected, with a rotation mechanism such as a bearing or bushing used to permit the single spring button assembly 224 to rotate freely relative to base portion 104.

In FIGS. 2A-2C, the rotation of top sidewall 102 is tracked by optical sensor 120, although this rotation may also be detected mechanically, through the use of devices such as potentiometers or various control knobs. In example embodiments 200a-200c, a haptic actuator 116 is provided to output vibrations tuned to produce a tactile feedback as top sidewall 102 is rotated, although haptic actuator 116 may or may not be required if a potentiometer or other control knob is used, as would be appreciated by persons of ordinary skill in the art.

Figure 3:
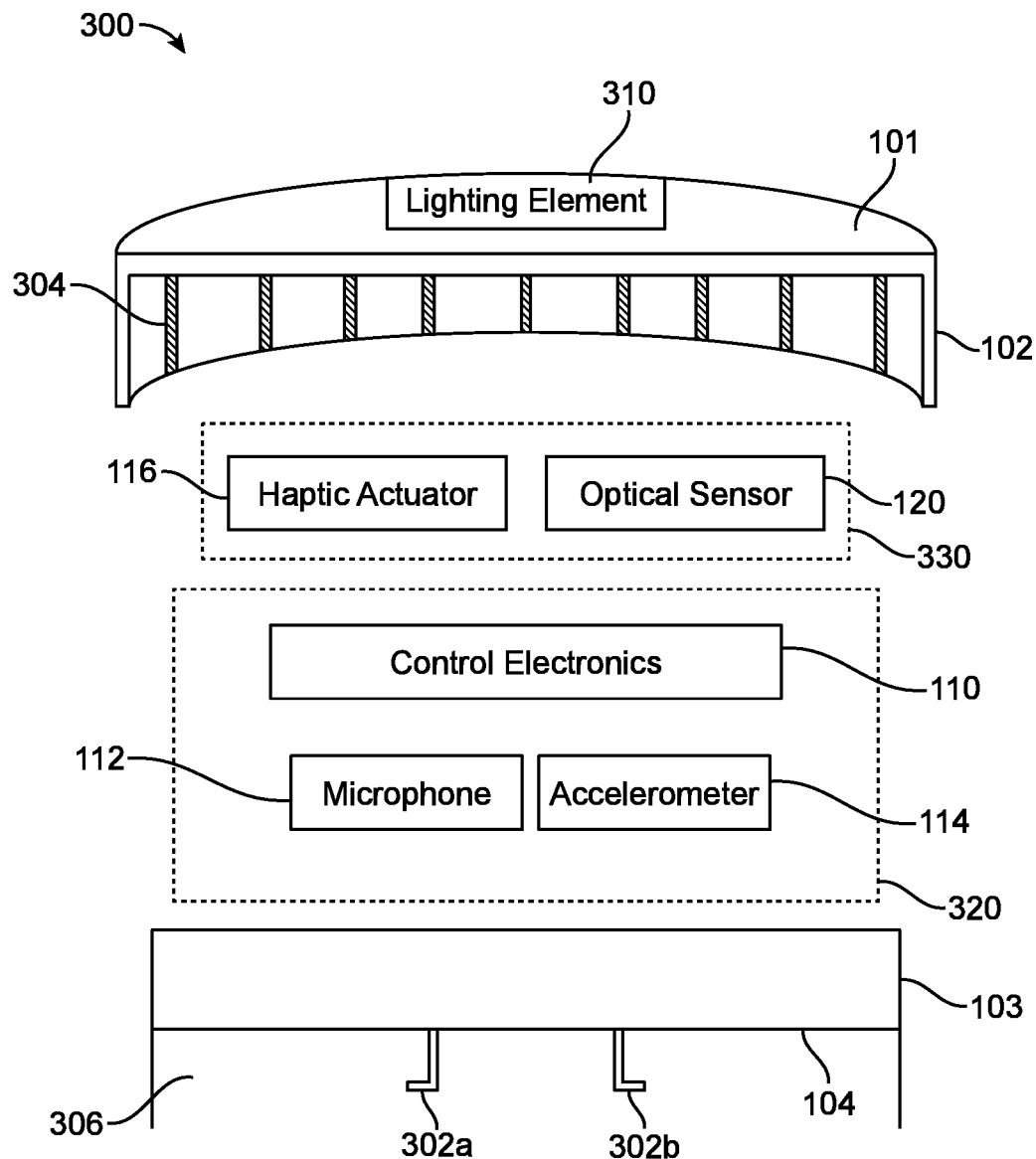
FIG. 3 shows a schematic illustration of an example satellite microphone assembly with an optical encoder.

FIG. 3 provides a schematic illustration of an example satellite microphone assembly 300 using an optical encoder to detect rotation and volume adjustment inputs. Satellite microphone assembly 300 contains upper components 330, comprising optical sensor 120 and haptic actuator 116, and base components 320, comprising volume control electronics 110, microphone 112, and accelerometer 114. Base components 320 are disposed in base portion 104 such that they remain below some height defined by the height of base sidewall 103. Upper components 330 may also be disposed in base portion 104, but are arranged such that they exceed the height defined by the height of base sidewall 103, particularly in the case of optical sensor 120. Two cable storage hooks 302a and 302b may also be provided in a hollow storage portion 306 below base portion 104, in order to store a connecting cable 150 (not pictured) in a coiled storage position when satellite microphone assembly 300 is not in use.

The interior surface of top sidewall 102 contains a plurality of evenly spaced optical indicators 304, such that the optical indicators are of a contrasting color with the remainder of the interior surface. In FIG. 3, the plurality of optical indicators 304 are depicted as shaded bars, with the interior surface of top sidewall 102 depicted in white, although a person of ordinary skill in the art would appreciate that a different pair of contrasting colors may be used to allow optical sensor 120 to detect the plurality of optical indicators 304 as they pass through the sensor's line of sight. In some embodiments, optical sensor 120 may instead use a light source and reflective optical indicators and detect the intensity of reflected light. Furthermore, while optical indicators 304 are depicted as vertical lines or columns, it is further appreciated that a variety of encoding means, such as binary codes or Gray codes, may be used instead.

Because the plurality of optical indicators 304 are evenly spaced, a number of identical sectors are defined between adjacent optical indicators. For example, if there are 10 sectors along the entire circular interior of top sidewall 102, and if optical sensor 120 detects two optical indicators passing consecutively in front of the sensor, then top sidewall 102 must have been rotated through at least one tenth of a full rotation, or 36°. Therefore, the limiting resolution of the optical detection system of such embodiments is defined by the number of sectors, and therefore, by the number of optical indicators. Depending on the number of optical indicators comprising the plurality of optical indicators 304, a single volume adjustment step may be defined by a rotation through one or more sectors, as detected by optical sensor 120 and transmitted to volume control electronics 110.

In order for optical sensor 120 to detect information about a direction of rotation of top sidewall 102, positional data must also be encoded along the interior of top sidewall 102. Persons of ordinary skill in the art would appreciate that this may be accomplished through the use of the aforementioned binary codes or Gray codes as the plurality of optical indicators 304, or through an additional encoding track distinct from the plurality of optical indicators 304. In such embodiments, optical sensor 120 is able to distinguish clockwise rotation from counter-clockwise rotation, and thereby output complete information about a direction and a degree of rotation of the cylindrical top portion to volume control electronics 110. Upon receipt of this information, volume control electronics 110 transmits a command to execute the volume adjustment, and may correspondingly update volume indicator 140. In some embodiments, volume control electronics 110 may also send a command to haptic actuator 116 to output vibrations tuned to produce a tactile feedback as volume adjustments are made.

Figure 4:
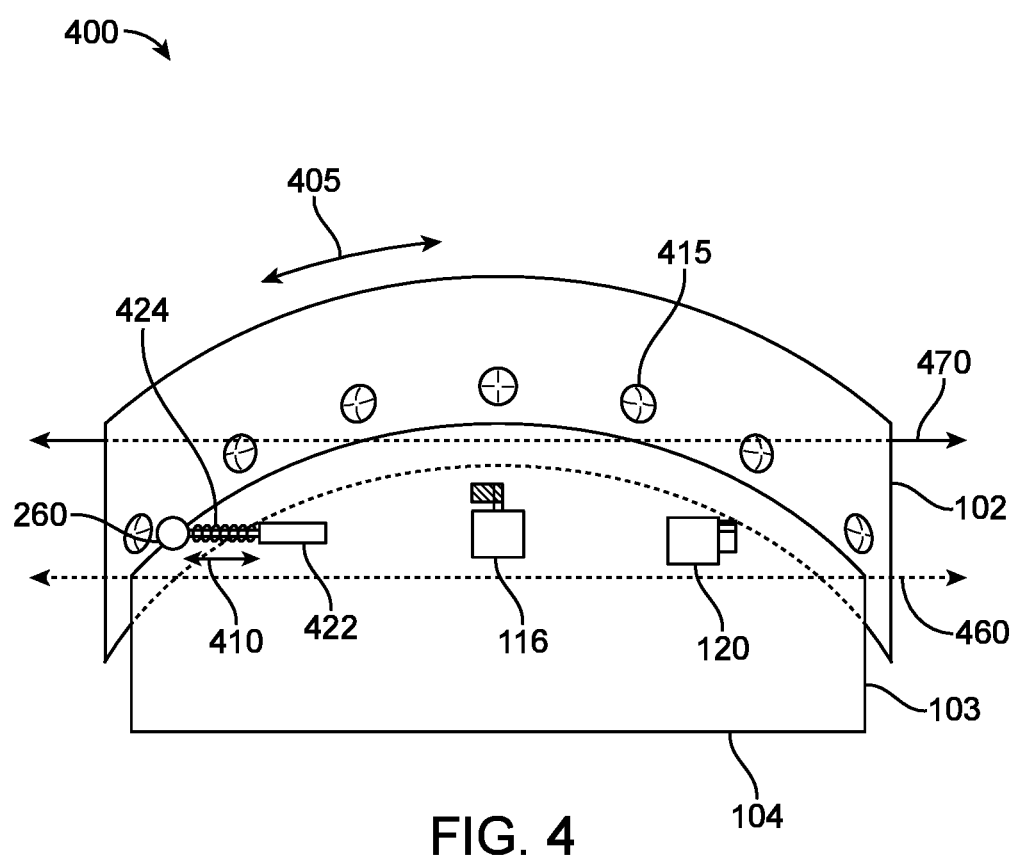
FIG. 4 illustrates a cross-section view of an example embodiment of a satellite microphone assembly using a detent mechanism.

FIG. 4 illustrates a cutaway view of an example embodiment 400 of a satellite microphone assembly using a detent mechanism to provide tactile feedback during volume adjustments. A cutaway line 460 indicates the top or maximum vertical height of base portion 104, and cutaway line 470 indicates the top or maximum vertical height of top sidewall 102. A detent mechanism consists of a detent head 420, mounted on the distal end of a detent spring assembly 424, which is slidably engageable with a detent body 422. Detent body 422 is mounted on or above the horizontal plane defined by cutaway line 460, and in some embodiments is rigidly affixed to resist movement in any direction.

The interior surface of top sidewall 102 contains a plurality of depressions 415, which are of a suitable diameter to engage and partially contain detent head 420 when it is positioned in a depression, and furthermore each serve to define a step or adjustment in volume. In such embodiments, the plurality of depressions 415 are identical and evenly spaced along the interior surface of sidewall 102, each having some maximum depth at their center and further having some minimum depth along their circumference such that the circumference is substantially flush with the interior surface of sidewall 102. In some embodiments, the transition between the maximum depth and minimum depth of the plurality of depressions 415 is gradual, for example tracing out a straight line or smooth curve, such that detent head 420 can slide smoothly in and out of any given depression. Detent body 422 is further mounted such that the center of detent head 420 is horizontally aligned with the center of each of the plurality of depressions 415.

When detent head 420 is positioned in a first given one of the plurality of depressions 415, detent spring assembly 424 is at a maximally extended length in the horizontal direction 410. From this position, and in the same direction 410, detent spring assembly 424 must compress and shorten in length when the cylindrical top portion and top sidewall 102 is rotated in a clockwise or counter-clockwise direction 405, and detent head 420 beings to slide out of the first given depression. During this compression, detent spring assembly 424 provides a resistive force, as a portion of the rotational energy of top sidewall 102 must be used to compress the spring. Once detent head 420 fully slides out of the first given depression, and top sidewall 102 continues to rotate in the same direction, detent spring assembly 424 remains in a steady state of compression, and friction forces between detent head 420 and the interior surface of top sidewall 102 provide an additional resistive force against the rotation. In some embodiments, the spring constant of detent spring assembly 424 or the coefficient of friction between detent head 420 and the interior surface of top sidewall 102 may be adjusted to modulate the magnitude of the resistive force.

As top sidewall 102 rotates further, detent head 420 approaches a second given depression, adjacent to the first given depression. Once detent head 420 makes contact with the sloped surface of the second given depression, detent spring assembly 424 begins to extend from its previously compressed state, this extension causing detent head 420 to slide towards the center of the second given depression until detent spring assembly 424 returns to its maximally extended length, independent of any external rotation forces applied to the cylindrical top portion or top sidewall 102.

Once detent head 420 snaps into place in the center of the second given depression, and detent spring assembly 424 is at its maximally extended length, any oscillations that may have been induced are dampened by the spring assembly as it is driven towards a resting state wherein the center of detent head 420 and the center of the second given depression lie on the same horizontal plane. As such, the detent mechanism provides an arresting force to the rotation of the cylindrical top portion and top sidewall 102, which indicates that a discrete volume step input has been made. In some embodiments, a potentiometer or other rotary knob is used to detect the direction and degree of rotation of the cylindrical top portion. In some embodiments an optical sensor 120 may be used to detect the direction and degree of rotation of the cylindrical topo portion. The information about the direction and degree of rotation of the cylindrical top portion is transmitted to volume control electronics 110, where the corresponding adjustments are made in the volume level and volume indicator 140. In various embodiments, a haptic actuator 116 may be used to provide additional tactile feedback to that already provided by the detent mechanism.

Figure 5A:
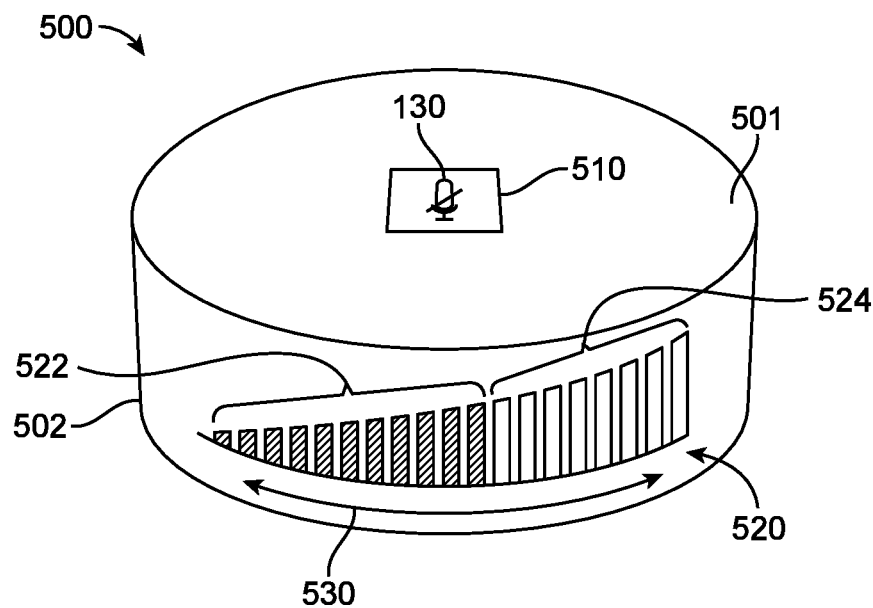
FIG. 5A illustrates an exterior view of an example embodiment of a satellite microphone assembly using electronic, touch-sensitive means to receive input.
Figure 5B:
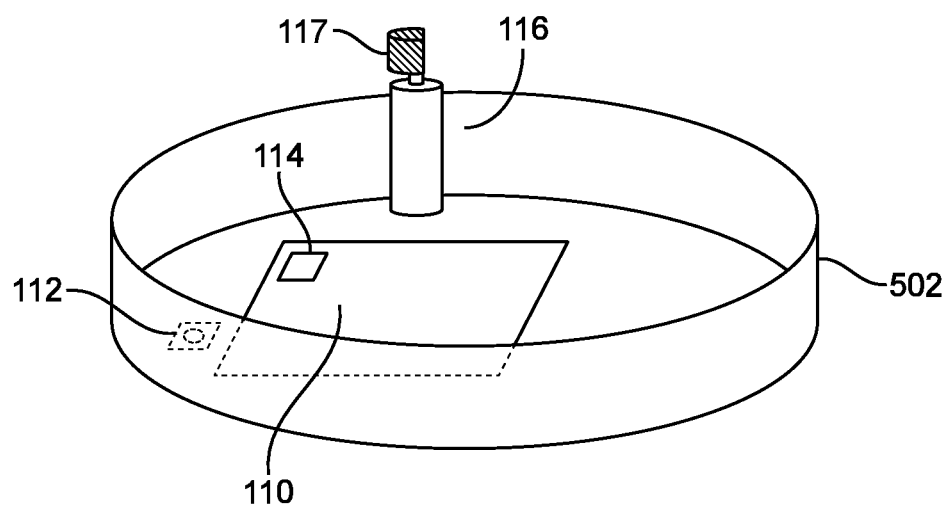
FIG. 5B illustrates an exploded view of an example embodiment of a satellite microphone assembly using electronic, touch-sensitive means to receive input.

FIGS. 5A and 5B illustrate an example embodiment of a satellite microphone assembly 500 that uses electronic, touch sensitive means rather than mechanical means to capture a volume adjustment input and a user touch or press to toggle a mute/unmute function of microphone 114. FIG. 5A illustrates an exterior view of satellite microphone assembly 500, which in some embodiments may contain no exterior moving parts, while FIG. 5B is a cutaway view of the interior components of satellite microphone assembly 500, depicting volume control electronics 110, microphone 112, accelerometer 114, and haptic actuator 116.

Satellite microphone assembly 500 has a top surface 510 containing a display 510, which can be an LCD or LED screen, for example. Display 510 can display a mute indicator 130 indicating a mute status of microphone 112, although persons of ordinary skill in the art would appreciate that display 510 may be used for a variety of other purposes such as providing a user interface or displaying additional information.

Top surface 501 can be sensitive to and detect user touches, presses, and gestures, either within a defined area or over the entirety of top surface 501, thereby being configured to be an actuatable button to toggle mute/unmute of microphone 112. Top surface 501 may be a resistive or a capacitive touchscreen in order to detect user touches, presses, and gestures, although persons of ordinary skill in the art would appreciate that other means may be used to detect user touches, presses, and gestures on top surface 501. A received user touch, press, or gesture causes a signal to be sent to volume control electronics 110, which, responsive to the signal, will toggle the mute/unmute status of microphone 112 and update mute indicator 130 displayed on display 510. In some embodiments, a haptic actuator 116 can output a vibration to provide tactile feedback to further indicate that the command to toggle the mute/unmute status of microphone 112 has been received. Persons of ordinary skill in the art would appreciate that further configurations of touch inputs at top surface 501 may be implemented as control means for satellite microphone assembly 500—for example, in some embodiments a sustained user touch or press of top surface 501 may cause a temporary mute function, wherein the status of microphone 112 is set to mute only while the user touch or press is maintained.

Satellite microphone assembly 500 has a sidewall surface 502 containing a volume indicator 520. A plurality of currently active volume bars 522 and a plurality of currently inactive volume bars 524 comprise a plurality of volume bars of volume indicator 520, and the number of currently active volume bars 522 out of the plurality of volume bars may indicate a current or user-selected volume level. In such embodiments, volume indicator 520 may comprise a single display panel or a number of distinct display panels each defining one or more of the plurality of volume bars. Persons of ordinary skill in the art would appreciate that a number of different displays may be suitable for such embodiments, for example flat or curved, LED or LCD displays, or furthermore, that an array of lighting elements may be used in place of a display panel.

Sidewall surface 502 can be sensitive to and detect user touches, presses, and gestures, either within a defined area or over the entirety of sidewall surface 502, thereby being configured to receive volume level adjustment inputs. Sidewall surface 502 can be a resistive or capacitive touchscreen in order to detect user touches, presses, and gestures, although persons of ordinary skill in the art would appreciate that other means may be used to detect user touches or presses on sidewall surface 502. A received user touch, press, or gesture causes a signal to be sent to volume control electronics 110, which, responsive to the signal, will make a corresponding adjustment in volume level and update volume indicator 520. In some embodiments, volume may be adjusted by a received user touch or press on sidewall surface 502, for example wherein one touch or press on the portion of sidewall surface 502 corresponding to active volume bars 522 may reduce the volume level by one step, and one touch or press on the portion of sidewall surface 502 corresponding to inactive volume bars 524 may increase the volume level by one step. Persons of ordinary skill in the art will appreciate that various areas of sidewall surface 502 may be assigned to correspond to touches or presses operative to either increase or reduce the volume level. In such embodiments, a haptic actuator 116 can output a vibration to provide tactile feedback to further indicate that the command to adjust the volume level has been received. In various embodiments, haptic actuator 116 may output constant strength vibrations or vibrations whose strength is a function of the current or user-selected volume level.

In some embodiments, sidewall surface 502 may detect swiping or sliding gestures that can be calculated to have some non-zero vector component along a circumferential direction 530, which may be used as input to control volume level adjustments. For example, as seen in the example of FIG. 5A, a swiping or sliding gesture toward the right would cause volume control electronics 110 to increase the volume level and update volume indicator 520 correspondingly, and a swiping or sliding gesture toward the left would cause volume control electronics 110 to decrease the volume level and update volume indicator 520 correspondingly. Volume control electronics 110 may correlate the swiping or sliding gesture input to an amount of volume level adjustment in a variety of ways, for example, based on the distance of the gesture, the speed of the gesture, or the width of the contact patch detected, although persons of ordinary skill in the art would appreciate that various embodiments may include other correlation factors between the gesture input and the amount of volume level adjustment. It is further appreciated that various embodiments may permit either discrete or continuous adjustments in volume level.

In some embodiments, a haptic actuator 116 can output a vibration to provide tactile feedback to further indicate that the command to adjust the volume level has been received. In various embodiments, haptic actuator 116 may output discrete vibrations, of constant or variable strength, or haptic actuator 116 may output a continuous vibration correlated to the current or user-selected volume level.

An accelerometer 114 outputs acceleration data to volume control electronics 110, thereby detecting either a resting state or a movement state of satellite microphone assembly 500. While illustrated as a constituent component of the volume control electronics in FIG. 5B, persons of ordinary skill in the art would appreciate that accelerometer 114 may be located anywhere within the satellite microphone assembly 500 so long as it is communicatively linked to the volume control electronics 110. In a resting state of satellite microphone assembly 500, accelerometer 114 may detect zero or minimal acceleration, ignoring any effects of gravity. For example, a resting state might correspond to satellite microphone assembly 500 resting flat on a table. In a resting state, volume control electronics 110 are enabled, and operative to capture input from the actuatable button function of top surface 501 and volume level adjustment input from sidewall surface 502. The resting state may be determined instantaneously or determined over some pre-defined period of time. In the resting state, satellite microphone assembly 500 functions normally and as described above.

However, if satellite microphone assembly 500 is picked up or otherwise physically moved, particularly during an active phone call or other audio transmission session, one or more of the actuatable button function and the volume level adjustment function may be inadvertently toggled or otherwise engaged. Such control inputs are undesirable, and as such, accelerometer 114 is configured to detect a moving state of satellite microphone assembly 500 and disable volume control electronics 110. A moving state is generally understood to correspond to a translational velocity along one or more of the axes of detection of accelerometer 114, wherein acceleration in the direction of each axis is either not currently substantially equal to zero or has not remained substantially equal to zero for some pre-defined period of time. By disabling volume control electronics 110, any inadvertent input will be ignored, and no mute or volume level adjustments may be made until the satellite microphone assembly 500 returns to a resting state. In some embodiments, it may be possible to disable this feature of satellite microphone assembly 500 and simply keep volume control electronics 110 in a constantly enabled state.

Figure 6:
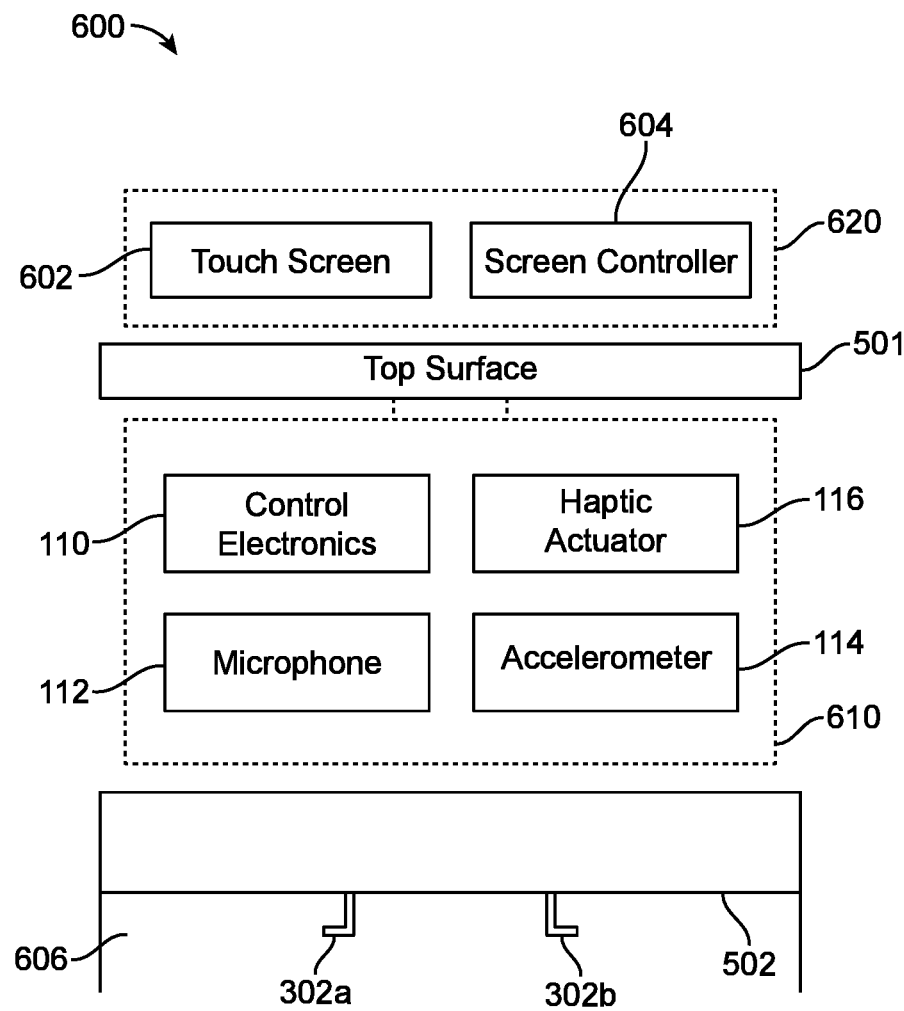
FIG. 6 shows a schematic illustration of an example satellite microphone assembly using electronic, touch-sensitive means to receive input.

FIG. 6 provides a schematic illustration 600 of example satellite microphone assembly 500. Satellite microphone assembly 500 contains external components 620, comprising one or more touch screens 602 and one or more screen controllers 604, and internal components 610, comprising control electronics 110, microphone 112, accelerometer 115, and haptic actuator 116. Two cable storage hooks 302a and 302b may also be provided in a hollow storage portion 606 below the base of sidewall surface 502, in order to store a connecting cable 150 (not pictured) in a coiled storage position when satellite microphone assembly 500 is not in use.

Figure 7:
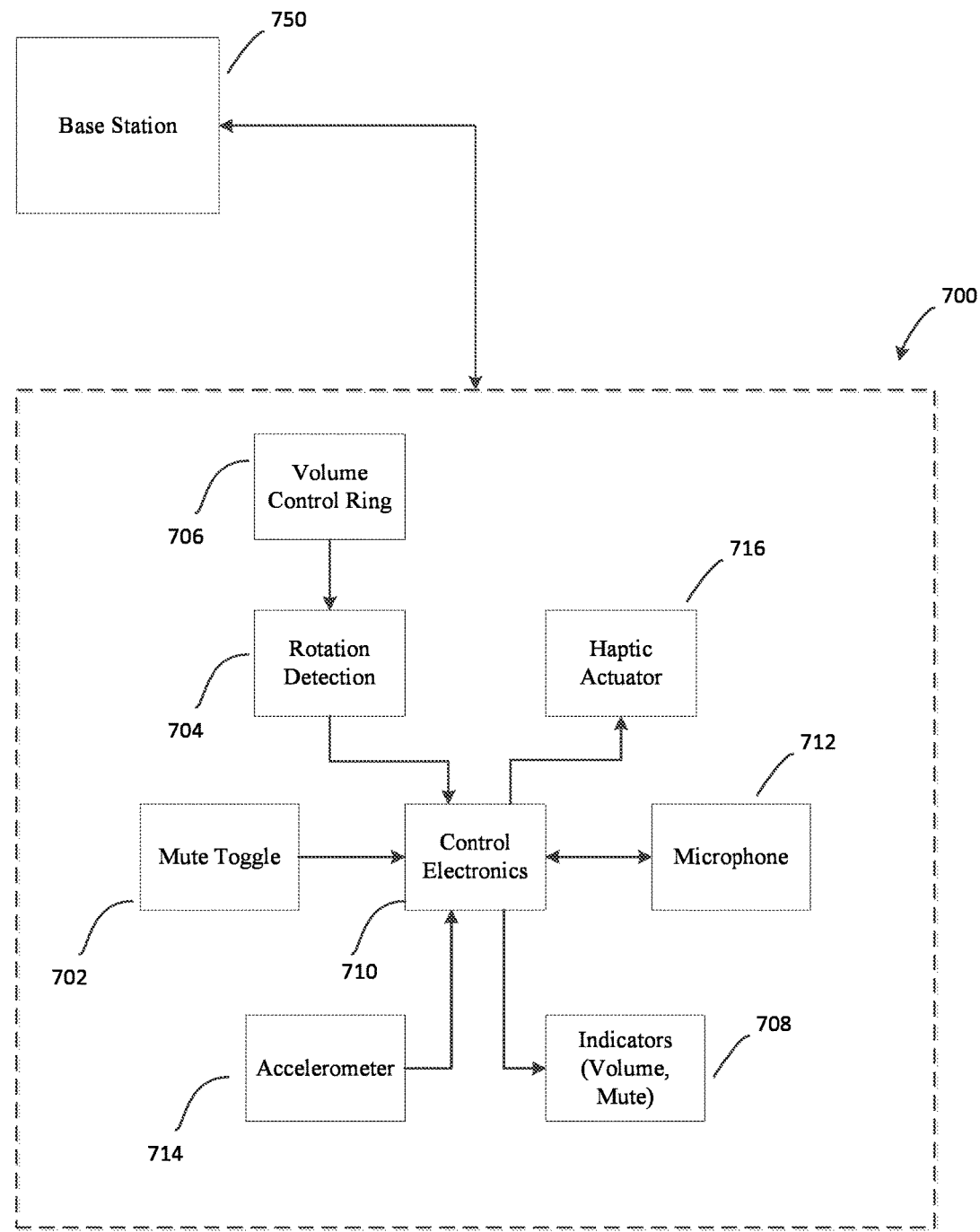
FIG. 7 illustrates a block diagram of an example satellite microphone assembly and the connections between its constituent components.

FIG. 7 illustrates a block diagram of an example satellite microphone assembly 700, with its constituent components contained within the dotted lines. A base station 750 is communicatively linked with satellite microphone assembly 700, as indicated by the directionality of the arrow linking these two systems. At the center of satellite microphone assembly 700 is a control electronics 710, which may contain one or more processors for receiving, analyzing, and transmitting data and commands or instructions. A mute toggle 702 is linked to transmit data to control electronics 710 indicative of an input to toggle the mute/unmute status of a microphone 712, wherein the input may comprise the actuation of a push button. Mute toggle 702 may use mechanical means, electrical means, or some combination thereof to receive input. Upon receipt of an input to toggle the mute/unmute status of microphone 712, control electronics 710 transmits a signal to toggle the mute/unmute status of microphone 712 and additionally may update a visual indicator 708 such as an external display or status light.

A volume control ring 706 is used to receive input for a volume adjustment level, and may use mechanical means, electrical means, or some combination thereof to receive input. A rotation detection mechanism 704 monitors volume control ring 706 and determines a direction and degree of rotation of volume control ring 706, and may be implemented as an optical sensor or a rotary knob in some embodiments. Rotation detection mechanism 704 outputs information about the direction and degree of rotation of volume control ring 706 to volume control electronics 710, which uses this information to make corresponding updates in the volume level and additionally may update a visual indicator 708 such as one or more external displays or status lights.

When an input is received at control electronics 710 from either rotation detection mechanism 704 or mute toggle 702, control electronics 710 sends a signal to generate tactile feedback to a haptic actuator 716. Haptic actuator 716 outputs one or more types of vibrations to provide tactile feedback for at least one of a volume level adjustment and a mute toggle. In various embodiments, haptic actuator 716 may be replaced or supplemented with mechanical means of providing tactile feedback, such as a detent mechanism.

An accelerometer 714 may detect one of a resting state or a moving state of satellite microphone assembly 700 and output data to control electronics 710. Responsive to the detection of a resting state, control electronics 710 remain enabled, and responsive to the detection of a moving state, control electronics 710 are disabled for the duration of the moving state. In a resting state of satellite microphone assembly 500, accelerometer 714 may detect zero or minimal acceleration, ignoring any effects of gravity. The resting state may be determined instantaneously or determined over some pre-defined period of time. A moving state is generally understood to correspond to a translational velocity along one or more of the axes of detection of accelerometer 714, wherein acceleration in the direction of each axis is either not currently substantially equal to zero or has not remained substantially equal to zero for some pre-defined period of time. In some embodiments, it may be possible to disable this feature of satellite microphone assembly 700 and simply keep control electronics 710 in a constantly enabled state.

Microphone 712 is communicatively linked with control electronics 710, as two-way communication is required for microphone 712 to transmit captured audio data and for control electronics 710 to transmit control signals to toggle the mute/unmute status of microphone 712. In some embodiments, one or more of base station 750, control electronics 710, and microphone 712 may be adapted to perform signal processing on the audio stream captured at microphone 712, for example to remove background or otherwise undesirable noise. Microphone 712 may record noise generated by haptic actuator 716 or a detent mechanism as tactile feedback is provided for a volume level adjustment, or microphone 712 may record noise generated by haptic actuator 716 or mute toggle 702 as tactile feedback is provided for a toggle of the mute/unmute status. Persons of ordinary skill in the art would appreciate that this signal processing may be performed in analog or digital fashion, and furthermore is not limited to be performed solely on the above identified examples of background noise, nor limited to be performed solely at one or more of the three identified hardware locations.

Figure 8:
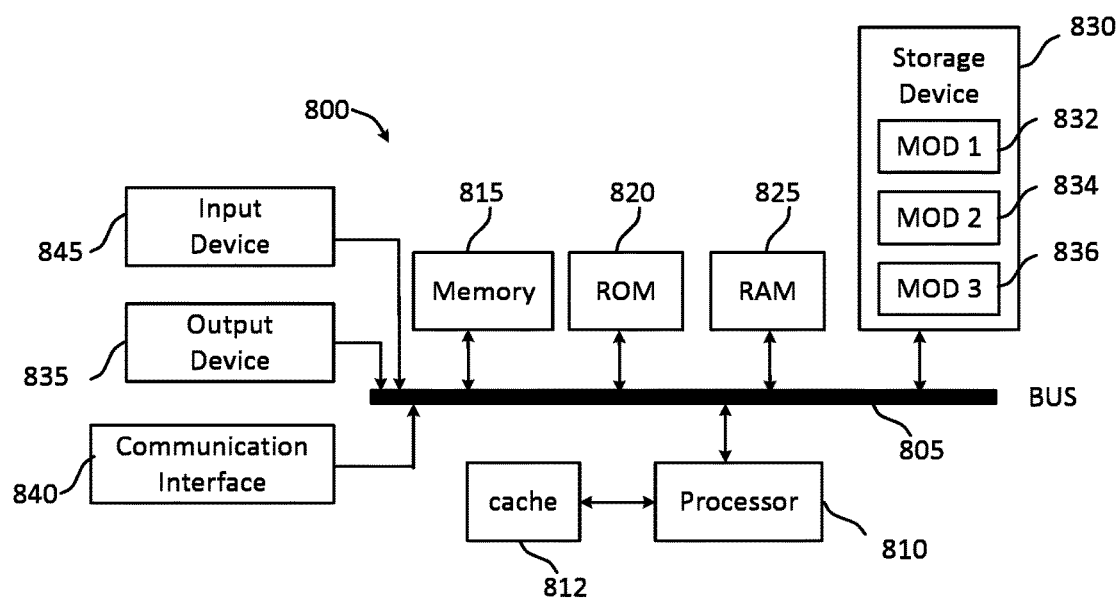
FIG. 8 illustrates a system bus computing system architecture for use in the various embodiments described herein.

Some of the embodiments described herein rely on software in conjunction with hardware to carry out the described functions. It will be understood by those of ordinary skill in the art that a computing system such as illustrated in FIG. 8 can be used to store and execute software that is effective to receive inputs from hardware devices or instruct hardware device to provide outputs as described herein. As such FIG. 8 illustrates a system bus computing system architecture 800 wherein the components of the system are in electrical communication with each other using a bus 805. Exemplary system 800 includes a processing unit (CPU or processor) 810 and a system bus 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware module or software module, such as module 1 832, module 2 834, and module 3 836 stored in storage device 830, configured to control the processor 810 as well as a special-purpose processor where software instructions are incorporated into the actual processor design. The processor 810 may essentially be a completely self-contained computing system, containing multiple cores or processors, a bus, memory controller, cache, etc. A multi-core processor may be symmetric or asymmetric.

To enable user interaction with the computing device 800, an input device 845 can represent any number of input mechanisms, such as a microphone for speech, a touch-sensitive screen for gesture or graphical input, keyboard, mouse, motion input, speech and so forth. An output device 835 can also be one or more of a number of output mechanisms known to those of skill in the art. In some instances, multimodal systems can enable a user to provide multiple types of input to communicate with the computing device 800. The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof.

The storage device 830 can include software modules 832, 834, 836 for controlling the processor 810. Other hardware or software modules are contemplated. The storage device 830 can be connected to the system bus 805. In one aspect, a hardware module that performs a particular function can include the software component stored in a computer-readable medium in connection with the necessary hardware components, such as the processor 810, bus 805, display 835, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Also, the terms "about", "substantially", and "approximately", as used herein with respect to a stated value or a property, are intend to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A satellite microphone assembly comprising:
a base housing a microphone and a volume control electronics;
a cap with a top surface and at least one side extending below the top surface, supported by the base and having volume based controls mounted on the top surface, the cap being configured to control the microphone of the satellite microphone assembly when a user moves the cap relative to the base; and
an optical sensor supported by the base, the optical sensor configured to detect movement of the cap, output information about a direction of the movement of the cap to the volume control electronics, and cause the movement of the cap to affect a volume of a speaker communicatively coupled to the satellite microphone assembly.

2. The satellite microphone assembly of claim 1, further comprising:
mechanical detents arranged to interface with the cap and to produce a tactile feedback when the cap is moved relative to the base.

3. The satellite microphone assembly of claim 1, further comprising:
a haptic actuator configured to receive an output of the optical sensor and configured to produce a tactile feedback when the cap is moved relative to the base via vibration.

4. The satellite microphone assembly of claim 1, wherein,
the top surface of the cap is touch sensitive, and a received touch activates an actuatable button to toggle mute/unmute of the microphone.

5. The satellite microphone assembly of claim 1, wherein,
the top surface of the cap is a physical button assembly operable to control the microphone when actuated.

6. The satellite microphone assembly of claim 1, further comprising:
an accelerometer supported by the base and configured to provide an output to the volume control electronics.

7. The satellite microphone assembly of claim 6, wherein,
the accelerometer is configured to detect a resting state of the satellite microphone assembly and to enable the volume control electronics.

8. The satellite microphone assembly of claim 6, wherein,
the accelerometer is configured to detect a movement state of the satellite microphone assembly and to disable the volume control electronics.

9. A satellite microphone comprising:
a base supporting a microphone;
a cap with a top surface and at least one side extending below the top surface, attached to the base and having volume based controls mounted on the top surface, the cap being moveable relative to the base;
a movement detector attached to the base, configured to detect movement of the cap relative to the base, and affect volume of a speaker of a speaker phone separate from the satellite microphone based on the movement; and
the volume based controls including a mute actuator configured to receive an input to mute/unmute the microphone.

10. The satellite microphone of claim 9, further comprising:
a plurality of mechanical members arranged to interface with the cap and to produce a tactile feedback when the cap is moved relative to the base.

11. The satellite microphone of claim 9, further comprising:
a haptic actuator configured to receive an output of the movement detector, and configured to produce a tactile-vibration feedback when the cap is moved relative to the base.

12. The satellite microphone of claim 9, wherein,
the mute actuator is touch sensitive to receive a user input to mute/unmute the microphone.

13. The satellite microphone of claim 9, wherein,
the mute actuator is a physical button assembly to receive a user input to mute/unmute the microphone.

14. The satellite microphone of claim 9, wherein,
the mute actuator has a surface area equal to a surface area of the top surface of the cap.

15. The satellite microphone of claim 9, further comprising:
an accelerometer supported by the base and configured to provide an output to the microphone.

16. The satellite microphone of claim 15, wherein,
the accelerometer is configured to detect a resting state of the satellite microphone, and to enable the microphone.

17. The satellite microphone of claim 15, wherein,
the accelerometer is configured to detect a movement state of the satellite microphone and to disable the microphone.

18. A method to control a satellite phone assembly, the method comprising:
moving a cap relative to a base of the satellite phone assembly,
wherein,
the base houses a microphone, a volume control electronics, and an optical sensor,
the cap with a top surface and at least one side extending below the top surface, supported by the base, and having volume based controls mounted on the top surface, the cap being configured to control the microphone when a user moves the cap relative to the base, and the optical sensor is supported by the base, configured to detect movement of the cap, output information about a direction of the movement of the cap to the volume control electronics, and cause the movement of the cap to affect a volume of a speaker communicatively coupled to the satellite phone assembly.

19. The method of claim 18,
wherein,
the movement is operable to generate tactile feedback via (i) mechanical detents arranged to interface with the cap, or (ii) a haptic actuator configured to receive an output of the optical sensor and vibrate.

20. The method of claim 18,
wherein,
the top surface of the cap is (i) touch sensitive and operable to control the microphone when touched, or (ii) a physical button assembly operable to control the microphone when actuated.

* * * * *